United States Patent
Chen

(10) Patent No.: US 6,844,771 B1
(45) Date of Patent: Jan. 18, 2005

(54) SELF-LEAKAGE DETECTION CIRCUIT OF DECOUPLING CAPACITOR IN MOS TECHNOLOGY

(75) Inventor: Chung-Hui Chen, Hsin-Chu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 0 days.

(21) Appl. No.: 10/671,293

(22) Filed: Sep. 25, 2003

(51) Int. Cl.$^7$ .............................................. H03K 17/92
(52) U.S. Cl. ..................................... 327/379; 327/545
(58) Field of Search ................................ 327/379, 380, 327/381, 384, 530, 534, 545, 546

(56) References Cited

U.S. PATENT DOCUMENTS

| | | | |
|---|---|---|---|
| 5,506,457 A | | 4/1996 | Krauter et al. ............... 307/129 |
| 5,770,969 A | * | 6/1998 | Walls et al. ................ 327/594 |
| 5,786,975 A | * | 7/1998 | Duncan et al. ............. 361/111 |
| 5,789,964 A | | 8/1998 | Voldman ..................... 327/380 |
| 5,828,259 A | * | 10/1998 | Cases et al. ................ 327/376 |
| 6,307,250 B1 | | 10/2001 | Krauter et al. .............. 257/532 |
| 2002/0081832 A1 | | 6/2002 | Bernstein et al. | |

* cited by examiner

Primary Examiner—Jeffrey Zweizig

(57) ABSTRACT

A new method to control a switchable decoupling capacitor in an integrated circuit device is achieved. The method comprises providing an integrated circuit device comprising a switchable decoupling capacitor. The switchable decoupling capacitor is initialized by a method comprising connecting the switchable decoupling capacitor between a power supply and ground. The state of the switchable decoupling capacitor is stored as enabled. The switchable decoupling capacitor is then controlled during operation of the integrated circuit device by a method comprising monitoring a voltage on a terminal of the switchable decoupling capacitor. The switchable decoupling capacitor is disconnected if the voltage exceeds a threshold level. The state of the switchable decoupling capacitor is stored as disabled if the switchable decoupling capacitor is disconnected.

25 Claims, 4 Drawing Sheets

SELF-LEAKAGE DETECTION CIRCUIT OF DECOUPLING CAPACITOR IN MOS TECHNOLOGY

BACKGROUND OF THE INVENTION (1) Field of the Invention

The invention relates to an integrated circuit device, and, more particularly, to a method to decouple switching current noise from a power supply of an integrated circuit device.

(2) Description of the Prior Art

Very high-speed integrated circuit devices present many design challenges. For example, synchronized switching of a large number of circuits, as with a very high-speed clock, can create very large switching currents. Referring now to FIG. 1, an exemplary integrated circuit block 10 is illustrated. The circuit block 10 is connected to power supply VDD 14 and ground 18. The circuit block 10 comprises a large number of logic circuits capable of very high-speed operation. During normal operation, internal circuit nodes, such as NODE2 24 and NODE3 26 will switch states as synchronized by the system clock CLK 19. At any time, a large number of nodes may be switching. In addition, if a very high-speed clock frequency is used, then the switching speeds must be very fast. Where both a high switching speed and a high switching rate occur at the same time, a large switching current IVDD 28 is drawn on the VDD 14 line. These large switching currents can cause a substantial amount of switching noise to be coupled onto the VDD line 14 as shown. In very high-speed integrated circuit devices, VDD 14 is often set to a very low value of about 1V. A large switching noise can cause the circuit 10 to malfunction at such a low operating voltage level.

Referring now to FIG. 2, it has been found in the prior art that the addition of capacitance between the power supply VDD 32 and ground VSS 34 of an integrated circuit 30 can reduce the effect of switching current. High frequency components of the switching noise are shunted from VDD 32 to VSS 34 through a decoupling capacitance $C_D$ 36.

Referring now to FIG. 3, yet another approach to the decoupling capacitor is illustrated. In this case, a MOS capacitor 62 and a MOS transistor 64 are connected in series between VDD 72 and ground 74. It is observed in the art that, as process technology shrinks to sub-0.13 micron, MOS gate leakage current becomes a serious problem. This leakage occurs because a very thin gate oxide layer 70 is used between the polysilicon 66 and the substrate 50 or n-well 54 to form the gates 62 and 64. At the same time, the supply voltage for a sub-0.13 micron process is typically about 1 Volt while the operating frequency is very high. Therefore, a large decoupling capacitance, perhaps as large as the total gate capacitance of the circuit, is required to suppress switching noise on the supply VDD 72. Unfortunately, when very large decoupling capacitors 62 are formed using MOS gates, the large gate leakage can cause an unacceptable current drain on the circuit. In addition, the large gate area of the decoupling capacitors 62 is a likely location for a gate defect that can cause the capacitor to be shorted.

It is found in the prior art that the series connected MOS transistor 64 may be used as a switch to shut OFF the decoupling capacitor 62 connection to ground 74. In particular, the decoupling capacitor 62 may be tested for excessive leakage during power-up. If excessive leakage is detected, then the MOS switch 64 is shut OFF during all circuit operation. In any case, after power-up, the MOS switch 64 is controlled by a static signal 76.

Several prior art inventions relate to methods to decouple switching current noise from a power supply of an integrated circuit device. U.S. Pat. No. 5,506,457 to Krauter et al and U.S. Pat. No. 6,307,250 B1 to Krauter et al teach a circuit to detect a defective decoupling capacitor during a power-up test. The defective capacitor is switched out of the circuit. U.S. Pat. No. 5,789,964 to Voldman shows a method to detect a defective decoupling capacitor during power-up and to switch in a capacitor during an ESD event. U.S. Patent Application 2002-0081832 A1 to Bernstein et al describes a circuit to test decoupling capacitors in an integrated circuit device. If a decoupling capacitor fails, then a fuse is blown to disable a grounding switch.

SUMMARY OF THE INVENTION

A principal object of the present invention is to provide an effective and very manufacturable integrated circuit device.

A further object of the present invention is to provide a method to control a decoupling capacitor in an integrated circuit device.

A yet further object of the present invention is to detect and to disconnect a leaking decoupling capacitor.

A yet further object of the present invention is to perform detection during normal operation of the circuit.

A yet further object of the present invention is to provide a method that is compatible with several capacitor configurations.

Another further object of the present invention is to provide a leakage detection and control circuit for a decoupling capacitor in an integrated circuit device.

In accordance with the objects of this invention, a method to control a switchable decoupling capacitor in an integrated circuit device is achieved. The method comprises providing an integrated circuit device comprising a switchable decoupling capacitor. The switchable decoupling capacitor is initialized by a method comprising connecting the switchable decoupling capacitor between a power supply and ground. The state of the switchable decoupling capacitor is stored as enabled. The switchable decoupling capacitor is then controlled during operation of the integrated circuit device by a method comprising monitoring a voltage on a terminal of the switchable decoupling capacitor. The switchable decoupling capacitor is disconnected if the voltage exceeds a threshold level. The state of the switchable decoupling capacitor is stored as disabled if the switchable decoupling capacitor is disconnected.

Also in accordance with the objects of this invention, an integrated circuit device is achieved. The device comprises a switchable decoupling capacitor coupled between a power supply and ground. The switchable decoupling capacitor comprises a capacitor and a switch connected in series. A means to initialize the switchable decoupling capacitor is used. A means to monitor a voltage on a terminal of the switchable decoupling capacitor is included. A means to control the switch based on the voltage is used. A means to store the state of the switchable decoupling capacitor is included.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to control a switchable decoupling capacitor in an integrated circuit device. Two embodiments of control circuits are also disclosed. It should be clear to those experienced in the art that the present invention can be applied and extended without deviating from the scope of the present invention.

Figure 1:
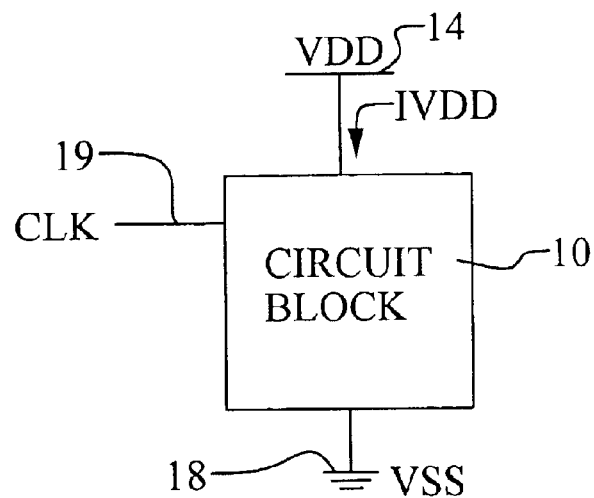
FIG. 1 illustrates switching noise coupling onto the power supply of a circuit block.
Figure 2:
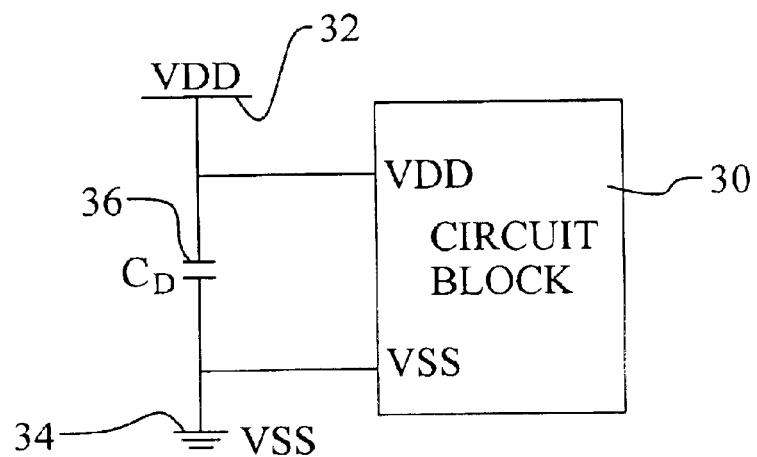
FIG. 2 illustrates a prior art approach to decoupling high frequency switching noise for a power supply.
Figure 3:
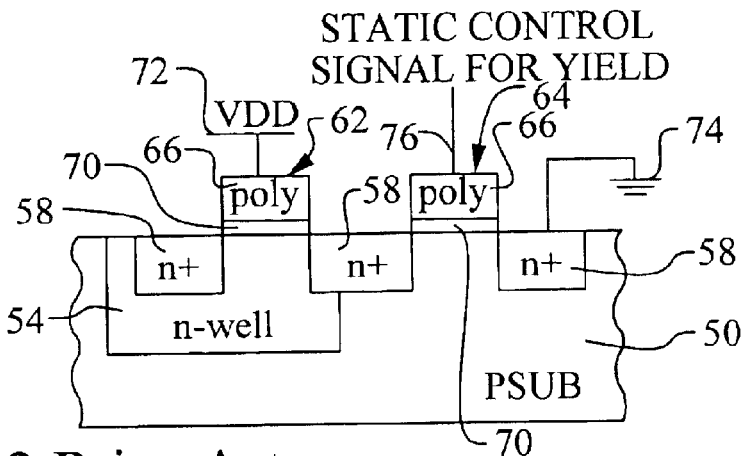
FIG. 3 illustrates a prior art switchable capacitor used for decoupling.
Figure 4:
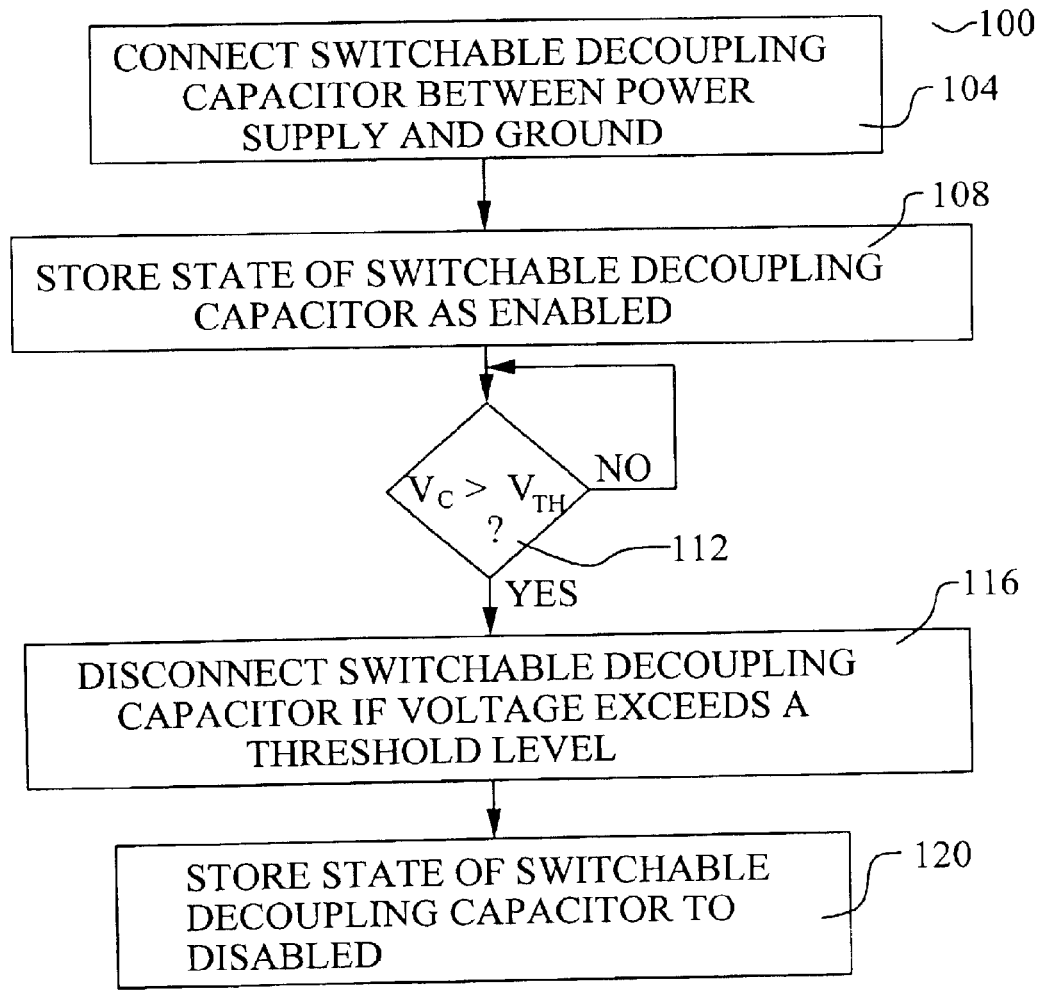
FIG. 4 illustrates the preferred embodiment of the method of the present invention.
Figure 5:
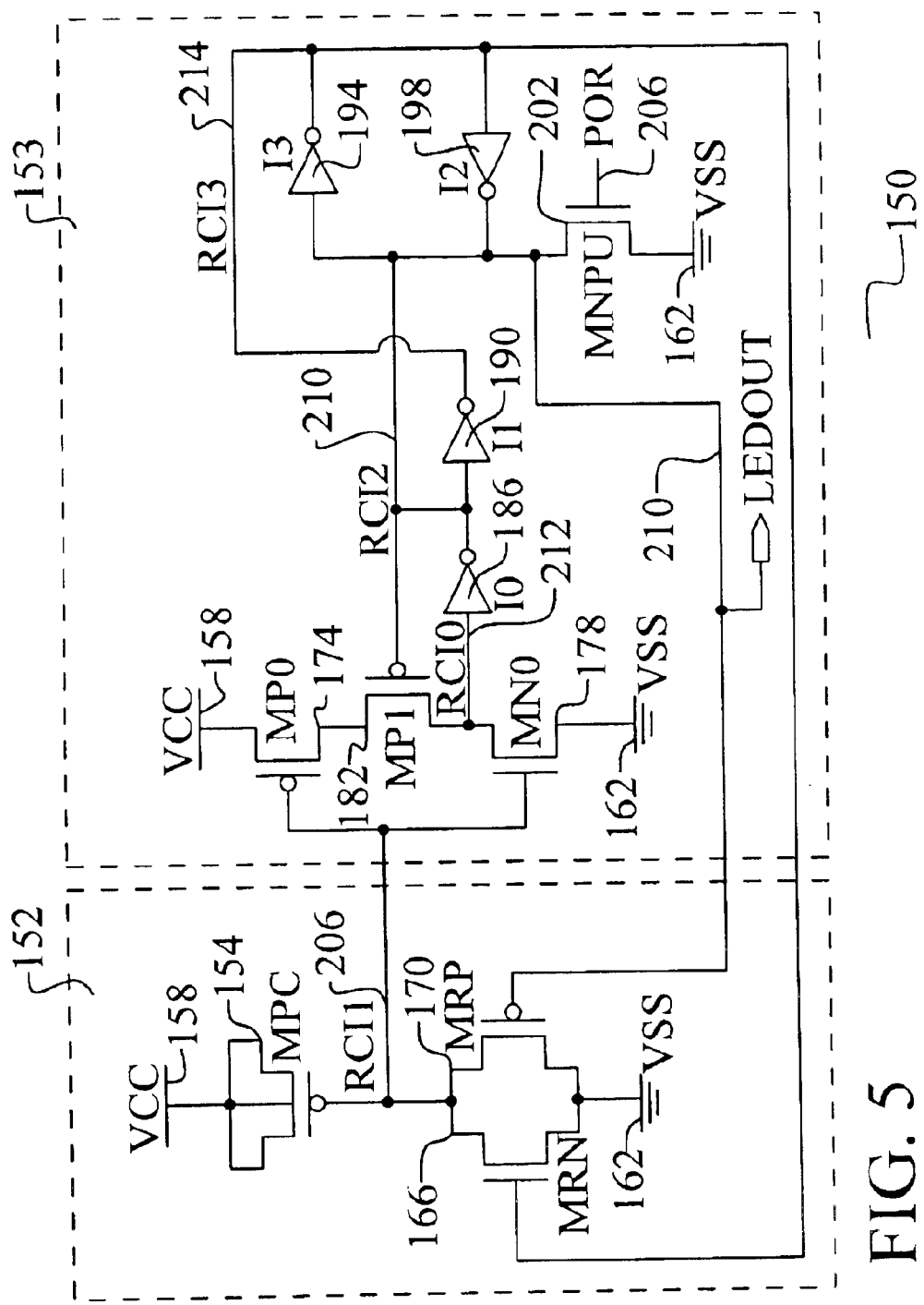
FIG. 5 illustrates a first preferred embodiment of the present invention.

Referring now to FIG. 4, the preferred embodiment of the method 100 of the present invention is illustrated. Several important features of the present invention are shown and discussed below. To facilitate the description of the method 100 of the present invention, reference is also made to FIG. 5 where a first preferred embodiment of a circuit device of the present invention is illustrated. The novel method and device solve several problems encountered in the prior art as will be described below.

Referring again to FIG. 5, a switchable decoupling capacitor 152 is provided as part of an integrated circuit device 150. A switchable decoupling capacitor 152 comprises a capacitor structure, such as the PMOS transistor MPC 154, that is connected between the power supply VCC 158 and the ground VSS 162 of the integrated circuit device 150. In addition, a switch, such as a CMOS pass gate formed by NMOS transistor MRN 166 and PMOS transistor MRP 170, is connected in series with the capacitor MPC 154. The switch 166 and 170 is capable of connecting or of disconnecting one terminal of the capacitor MPC 154. As can clearly be seen, if the pass gate 166 and 170 is ON, then current can flow from VCC 158, through the capacitor MPC 154, and to VSS 162. Conversely, if the pass gate is OFF, then current cannot flow from VCC 158, through the capacitor MPC 154, and to VSS 162. The pass gate 166 and 170 is controlled by the remainder of the circuit 153.

Referring again to FIG. 4, the preferred method 100 of controlling the above-described, switchable decoupling capacitor is illustrated. First, the switchable decoupling capacitor is connected between the power supply and ground in step 104. Referring again to FIG. 5, this means that the pass gate 166 and 170 is initially turned ON. In particular, an initialization signal, POR 206, is provided to the control circuit 153. For example, the POR signal 206 comprises a "power-on reset" signal that pulses high whenever the overall integrated circuit transitions from a powered down state to a powered up state. In the first embodiment circuit 153, the POR signal 206 controls an NMOS device MNPU 202. When POR 206 pulses high, the drain of MNPU 202 is pulled to VSS and causes the signal RCI2 210, also called LEDOUT 210, to be pulled to VSS. As a result, the PMOS, pass gate transistor MRP 170 is turned ON. In addition, the low level on RCI2 210 causes inverter I1 190 to pull the RCI3 214 signal to VCC. This causes the NMOS, pass gate transistor MRN 166 to turn ON. Since both of the pass gate transistors MRN 166 and MRP 170 are turned ON, the gate of decoupling capacitor 154 is connected to VSS 162 through the pass gate.

Referring again to FIG. 4, the state of the switchable decoupling capacitor is stored in step 108. In particular, the switchable decoupling capacitor is in an enabled state. This "enabled" state is stored in a memory element. Referring again to FIG. 5, the memory element of the circuit 153 comprises the inverters I3 194 and I2 198. The ring connection of inverters I3 194 and I2 198 forms a simple latch. During the POR 206 high pulse, the RCI2 210 signal is forced low as described above. This results in I3 194 driving node RCI3 214 high. Finally, a high level on RCI3 214 causes I2 198 to drive node RCI2 210 low. When the POR 206 pulse ends, or returns to a low level, the states of RCI3 214 and RCI2 210 are latched at "1" and "0", respectively, by the feedback of I3 194 and I2 198. In this way, the state of the switchable decoupling capacitor 152 is stored as "enabled."

Referring again to FIG. 4, the voltage ($V_c$) of a terminal of the switchable decoupling capacitor is monitored in step 112. Referring again to FIG. 5, a voltage divider is formed by the capacitor MPC 154 and the pass gate 170 and 166. The gate terminal of the capacitor MPC 154 forms the node RCI1 206. It is this terminal that is monitored according to the method of the present invention. With the pass gate transistors MRN 166 and MRP 170 ON, the pass gate resistance should be very low. In addition, the low frequency impedance of the capacitor 154 should be much higher than that of the pass gate 166 and 170. As a result, the voltage of the monitored node RCI1 206 should be nearly VSS 162 under DC conditions. However, if the PMOS capacitor MPC 154 exhibits a significant, gate oxide leakage current, then the DC voltage of node RCI1 206 will rise.

The voltage of RCI1 206 is monitored using the inverter formed by devices MP0 174, MP1 182, and MN0 178. In the "enabled" state, PMOS transistor MP1 182 is turned ON by the low level on signal RCI2 210 to thereby couple the drains of MP0 174 and MN0 178 through a low resistance. The gates of MP0 174 and MN0 178 are connected to the monitored node RCI1 206. If the capacitor MPC 154 exhibits a low gate leakage current, then the DC voltage of RCI1 206 should remain at near the VSS level 162. As a result, transistor MP0 174 will be ON, transistor MN0 178 will be OFF, and the inverter output, RCI0 212, will be at VCC. RCI0 212 is buffered by inverters I0 186 and I1 190. A high level on RCI0 212 reinforces the latched, low level on RCI2 210 and the latched, high level on RCI3 214.

Referring again to FIG. 4, if the monitored voltage exceeds the threshold level (VTH), then the switchable decoupling capacitor is disconnected in step 116. Referring again to FIG. 5, if the capacitor MPC 154 is leaking, then the low frequency impedance of the capacitor will be of the same order of magnitude as that of the ON-state pass gate 166 and 170. As a result, the RCI1 206 will increase in voltage as governed by the voltage division between the leaking capacitor and the pass gate. If RCI1 206 reaches the switching threshold of the inverter formed by MP0 174, MP1 182, and MN0 178, then MN0 178 will switch ON and MP0 174 will switch OFF. This switching forces the inverter output RCI0 212 to VSS. As a result, the RCI2 210 node and the RCI3 214 node are forced to new states of high and low, respectively, by the buffers I0 186 and I1 190. The new levels on RCI2 210 and RCI3 214 cause the pass gate transistors MRN 166 and MRP 170 to turn OFF. This causes the leaky capacitor MPC 154 to be disconnected and thereby eliminates the current leakage path.

Referring again to FIG. 4, a "disabled" state is stored to keep the capacitor in the disconnected state in step 120. Referring again to FIG. 5, the latch comprising I3 194 and I2 198 is overwritten by the buffers I0 186 and I1 190 to a new state of "disabled". In the disabled state, RCI2 210 is latched high and RCI3 is latched low. The circuit maintains this "disabled" state until the POR 206 signal is re-asserted. Note that the PMOS transistor MP1 182 is turned OFF in the "disabled" state. This prevents the inverter formed by MP0 174, MP1 182, and MN0 178 from leaking current or from toggling states due to noise on the floating gate RCI1 206.

The above-described method and circuit device provide a controlled response to a leaking decoupling capacitor 154. Note that the present invention provides continuous monitoring of the operation of the capacitor during normal operation of the integrated circuit. That is, the circuit does not simply check the status of the capacitor during a power-up sequence. Rather, the status of the capacitor is monitored at all times so that a marginal capacitor, that fails completely during a long operating time, will be detected and shut OFF. Further, it should be noted that the detection circuit 153 generates an output signal LEDOUT 210. This output LEDOUT 210 could be used to control yet other switchable decoupling capacitors. A redundant switchable decoupling capacitor could be selectively turned ON, using the LEDOUT signal 210, to replace a leaking capacitor that has been disconnected using the method and circuit herein described.

Figure 6:
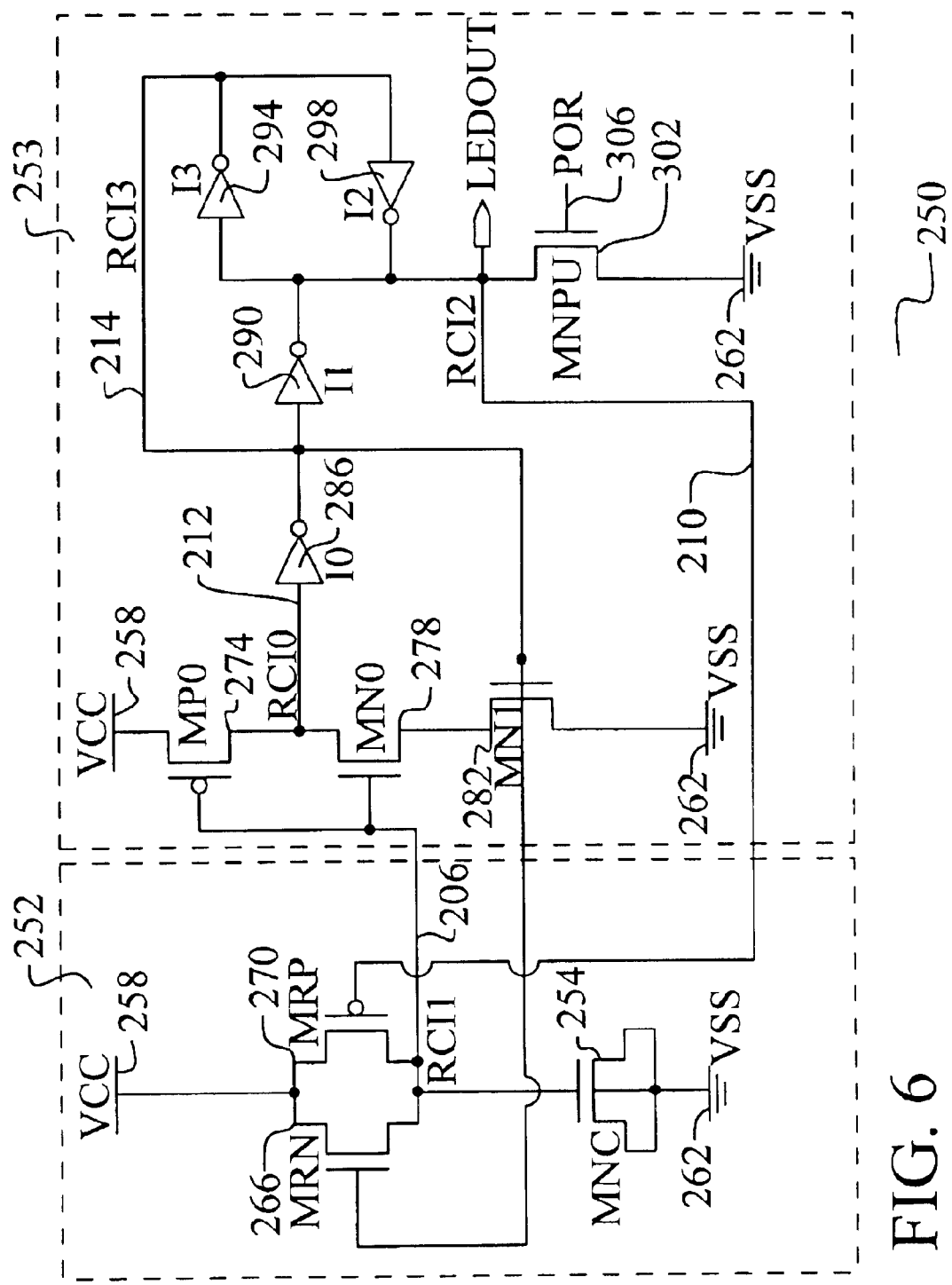
FIG. 6 illustrates a second preferred embodiment of the present invention.

Referring now to FIG. 6, a second preferred embodiment of the circuit device 250 present invention is illustrated. In this embodiment, the decoupling capacitor comprises a NMOS transistor MNC 254. The switchable decoupling capacitor 252 comprises this NMOS transistor MNC 254 and a CMOS pass gate formed by MRN 266 and MRP 270. The series stack of the capacitor 254 and the pass gate 266 and 270 is flipped such that the bulk of the capacitor is now connected directly to VSS 262 rather than to VCC 258 as in the first embodiment.

An additional difference in the second embodiment is the construction of the monitoring inverter. In the second embodiment, the monitoring inverter comprises one PMOS transistor MP0 274 and two NMOS transistors MN0 278 and MN1 282. Again, the gates of MP0 274 and MN0 278 are connected to the monitored terminal RCI1 206. MN1 282 is used to enable or disable the sensing inverter. In other respects, the architecture and operation of the second embodiment are similar to that of the first embodiment. In particular, MNPU 302 is used to initialize the circuit to the "enabled" state under the control of the POR signal 306. Inverters I2 298 and I3 294 form a latch for the storing the "enabled/disabled" state. Inverters I0 286 and I1 290 buffer the output of the sensing inverter and are capable of overdriving the state of the latch.

The advantages of the present invention may now be summarized. An effective and very manufacturable integrated circuit device is achieved. A method to control a decoupling capacitor in an integrated circuit device is achieved. Detection and disconnection of a leaking decoupling capacitor is performed using a novel method and circuit device. Leakage detection may be performed during normal operation of the circuit. The method is compatible with different capacitor configurations. A decoupling capacitor, leakage detection and control circuit for an integrated circuit device is achieved.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to control a switchable decoupling capacitor in an integrated circuit device comprising:
   providing an integrated circuit device comprising a switchable decoupling capacitor;
   initializing said switchable decoupling capacitor by a method comprising:
      connecting said switchable decoupling capacitor between a power supply and ground; and
      storing the state of said switchable decoupling capacitor as enabled;
   thereafter controlling said switchable decoupling capacitor during operation of said integrated circuit device by a method comprising:
      monitoring a voltage on a terminal of said switchable decoupling capacitor;
      disconnecting said switchable decoupling capacitor if said voltage exceeds a threshold level; and
      storing said state of said switchable decoupling capacitor as disabled if said switchable decoupling capacitor is disconnected.

2. The method according to claim 1 wherein said switchable decoupling capacitor comprises a capacitor and a switch connected in series.

3. The method according to claim 2 wherein said capacitor comprises a PMOS gate, wherein a first terminal of said capacitor is connected to said power supply, wherein a second terminal of said capacitor is connected to a first terminal of said switch, and wherein a second terminal of said switch is connected to said ground.

4. The method according to claim 2 wherein said switch comprises a CMOS transfer gate.

5. The method according to claim 2 wherein said capacitor comprises a NMOS gate, wherein a first terminal of said capacitor is connected to said ground, wherein a second terminal of said capacitor is connected to a first terminal of said switch, and wherein a second terminal of said switch is connected to said power supply.

6. The method according to claim 1 wherein said step of monitoring a voltage across said switchable decoupling capacitor comprises coupling said voltage to the input of an inverter.

7. The method according to claim 6 further comprising disabling said inverter when said voltage exceeds said threshold level.

8. The method according to claim 1 wherein said step of storing the state of said switchable decoupling capacitor as enabled and said step of storing the state of said switchable decoupling capacitor as disabled are performed by a latch.

9. The method according to claim 1 wherein said steps of connecting and disconnecting said switchable decoupling capacitor comprises generating a signal and wherein said signal is used to control additional said switchable decoupling capacitors.

10. A method to control a switchable decoupling capacitor in an integrated circuit device comprising:
   providing an integrated circuit device comprising a switchable decoupling capacitor wherein said switchable decoupling capacitor comprises a capacitor and a switch connected in series;
   initializing said switchable decoupling capacitor by a method comprising:
      connecting said switchable decoupling capacitor between a power supply and ground; and storing the state of said switchable decoupling capacitor as enabled;

thereafter controlling said switchable decoupling capacitor during operation of said integrated circuit device by a method comprising:

monitoring a voltage on a terminal of said switchable decoupling capacitor by coupling said voltage to the input of an inverter;

disconnecting said switchable decoupling capacitor if said voltage causes said inverter to switch; and storing said state of said switchable decoupling capacitor as disabled if said switchable decoupling capacitor is disconnected.

11. The method according to claim 10 wherein said capacitor comprises a PMOS gate, wherein a first terminal of said capacitor is connected to said power supply, wherein a second terminal of said capacitor is connected to a first terminal of said switch, and wherein a second terminal of said switch is connected to said ground.

12. The method according to claim 10 wherein said switch comprises a CMOS transfer gate.

13. The method according to claim 10 wherein said capacitor comprises a NMOS gate, wherein a first terminal of said capacitor is connected to said ground, wherein a second terminal of said capacitor is connected to a first terminal of said switch, and wherein a second terminal of said switch is connected to said power supply.

14. The method according to claim 10 further comprising disabling said inverter when said voltage causes said inverter to switch.

15. The method according to claim 10 wherein said step of storing the state of said switchable decoupling capacitor as enabled and said step of storing the state of said switchable decoupling capacitor as disabled are performed by a latch.

16. The method according to claim 10 wherein said steps of connecting and disconnecting said switchable decoupling capacitor comprises generating a signal and wherein said signal is used to control additional said switchable decoupling capacitors.

17. An integrated circuit device comprising:

a switchable decoupling capacitor coupled between a power supply and ground capacitor wherein said switchable decoupling capacitor comprises a capacitor and a switch connected in series;

a means to initialize said switchable decoupling capacitor;

a means to monitor a voltage on a terminal of said switchable decoupling capacitor;

a means to control said switch based on said voltage; and a means to store the state of said switchable decoupling capacitor.

18. The device according to claim 17 wherein said capacitor comprises a PMOS gate, wherein a first terminal of said capacitor is connected to said power supply, wherein a second terminal of said capacitor is connected to a first terminal of said switch, and wherein a second terminal of said switch is connected to said ground.

19. The device according to claim 17 wherein said switch comprises a CMOS transfer gate.

20. The device according to claim 17 wherein said capacitor comprises a NMOS gate, wherein a first terminal of said capacitor is connected to said ground, wherein a second terminal of said capacitor is connected to a first terminal of said switch, and wherein a second terminal of said switch is connected to said power supply.

21. The device according to claim 17 wherein said means to monitor a voltage on a terminal of said switchable decoupling capacitor comprises an inverter.

22. The device according to claim 21 wherein said inverter further comprises a means to disable said inverter when said voltage causes said inverter to switch.

23. The device according to claim 17 wherein said means to store the state of said switchable decoupling capacitor comprises a latch.

24. The device according to claim 23 wherein said means to initialize said switchable decoupling capacitor comprises a second switch to turn ON said switchable decoupling capacitor switch during initialization.

25. The device according to claim 17 wherein said means to control said switchable decoupling capacitor comprises a signal and wherein said signal is used to control additional said switchable decoupling capacitors.

* * * * *